United States Patent
Tokuda et al.

(10) Patent No.: US 6,730,183 B2
(45) Date of Patent: *May 4, 2004

(54) LAMINATED CERAMIC ELECTRONIC COMPONENTS AND MANUFACTURING METHOD THEREFOR

(75) Inventors: Hiromichi Tokuda, Takefu (JP);
Shingo Okuyama, Takefu (JP);
Tsuyoshi Tatsukawa, Takefu (JP);
Makoto Fukuda, Takefu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/741,686

(22) Filed: Dec. 20, 2000

(65) Prior Publication Data

US 2001/0015250 A1 Aug. 23, 2001

(30) Foreign Application Priority Data

Dec. 20, 1999 (JP) .............................. 11-361547
May 23, 2000 (JP) ....................... 2000-151757

(51) Int. Cl.$^7$ ............................................ H01F 41/04
(52) U.S. Cl. ................. 156/89.12; 156/89.16; 156/235; 156/239; 427/58; 427/96
(58) Field of Search ........................... 156/89.12, 89.16, 156/89.14, 235, 239, 240, 277, 289; 29/25.02, 25.03; 361/321.2, 321.3; 428/209, 210, 901; 427/96, 116, 58

(56) References Cited

U.S. PATENT DOCUMENTS

| | | | | |
|---|---|---|---|---|
| 5,101,319 A | * | 3/1992 | Diffeyes et al. | |
| 5,415,945 A | * | 5/1995 | Azumi et al. | |
| 5,453,316 A | * | 9/1995 | Morii et al. | 428/210 |
| 5,534,290 A | * | 7/1996 | Rainwater et al. | 427/97 |
| 5,610,565 A | * | 3/1997 | Maeda et al. | |
| 5,865,920 A | * | 2/1999 | Sakuratani et al. | 156/89.16 |
| 5,935,358 A | * | 8/1999 | Yamasaki | 156/89.12 |
| 6,071,800 A | * | 6/2000 | Shigemoto et al. | |
| 6,154,114 A | * | 11/2000 | Takahashi | |
| 6,189,200 B1 | * | 2/2001 | Takeuchi et al. | 156/89.12 X |
| 6,223,422 B1 | * | 5/2001 | Takeuchi et al. | |
| 6,238,779 B1 | * | 5/2001 | Iwao et al. | 428/210 |
| 6,264,777 B1 | * | 7/2001 | Yamaguchi | 156/89.12 |
| 6,362,716 B1 | * | 3/2002 | Anbo et al. | |
| 6,376,085 B1 | * | 4/2002 | Oobuchi et al. | |
| 6,544,365 B2 | * | 4/2003 | Tokuda et al. | 156/89.12 |
| 6,551,426 B2 | * | 4/2003 | Okuyama et al. | 156/89.12 |
| 2001/0054472 A1 | * | 12/2001 | Okuyama et al. | 156/89.12 |

FOREIGN PATENT DOCUMENTS

| | | | |
|---|---|---|---|
| JP | 62-101454 | | 5/1987 |
| JP | 3-263310 | * | 11/1991 |
| JP | 5-55757 | | 3/1993 |
| JP | 6-61084 | * | 3/1994 |
| JP | 08-078266 | * | 3/1996 |
| JP | 10-177932 | * | 6/1998 |
| JP | 11-8156 | * | 1/1999 |
| JP | 11-097244 | * | 4/1999 |
| JP | 11-111551 | * | 4/1999 |
| JP | 11-150034 | * | 6/1999 |
| JP | 11-101516 | | 7/1999 |

* cited by examiner

Primary Examiner—Curtis Mayes
(74) Attorney, Agent, or Firm—Keating & Bennett, LLP

(57) ABSTRACT

A manufacturing method for a laminated ceramic electronic component is performed such that the thickness of the inner electrode is greatly increased, delamination does not occur, and reliability is superior. The manufacturing method for the laminated ceramic electronic component includes a process in which a green sheet including the inner electrode paste layer and the ceramic paste layer, is provided on a carrier sheet such that the inner electrode paste layer penetrates the green sheet from the top surface to the bottom surface thereof, and a process, in which laminates of the green sheet and the carrier film are adhered by pressing, and thereafter the carrier film is peeled off, are repeated to obtain the ceramic laminate, and the ceramic laminate is fired after pressing in the direction of the thickness to obtain the ceramic sintered body.

18 Claims, 11 Drawing Sheets

LAMINATED CERAMIC ELECTRONIC COMPONENTS AND MANUFACTURING METHOD THEREFOR

BACKGROUND OF THE INVENTION

1. Field of the Invention

The present invention relates to a manufacturing method for laminated ceramic electronic components used as, for example, inductors, LC components, and feedthrough capacitors, and to a laminated ceramic electronic component, and more specifically, the present invention relates to a manufacturing method for the laminated ceramic electronic component wherein the process of forming the inner electrode is improved and inner electrodes of increased thickness are provided, and relates to a laminated ceramic electronic component produced thereby.

2. Description of the Related Art

Laminated inductors using sintered materials obtained by integrally firing metals and ceramics are known. In the manufacture of a laminated inductor, first, an inner electrode paste for forming a coil conductor is printed on a ceramic green sheet. A through hole for electrically connecting the upper and lower inner electrodes is provided in the ceramic green sheet. Plural layers of the green sheets are laminated together and the obtained laminate is pressed in the direction of the thickness. Thereafter, the laminate is fired to produce a ceramic sintered body, and a pair of outer electrodes, which is electrically connected to the coil conductor, is provided on the outer surface of the ceramic sintered body.

In the aforementioned laminated inductors, the number of windings can be increased by increasing the number of laminated layers of the ceramic green sheet, and a large inductance can thereby be obtained.

In this method, however, when printing the inner electrode paste to form the coil conductor on the ceramic green sheet to accompany the increased number of laminated layers of the ceramic green sheet, at the time when the aforementioned laminate is obtained, the height difference between the portion where the inner electrode paste exists and the portion where the paste does not exist, greatly increases. Therefore, when the laminate is pressed in the direction of the thickness before firing, distortion occurs. Furthermore, after firing, an interlayer peeling phenomenon, called "delamination" occurs due to the aforementioned distortion.

On the other hand, in the aforementioned laminated inductor, to reduce the direct current resistance, it is necessary to increase the thickness of the coil conductor or to increase the width of the coil conductor. In this method, however, when printing the inner electrode paste on the ceramic green sheet to form the inner electrode, for example, the coil conductor, it is difficult to form a thick inner electrode by a single printing process step.

Even if the printing of the inner electrode paste is repeated several times and an inner electrode of large thickness is formed, when the laminate is pressed in the direction of the thickness, the aforementioned interlayer peeling phenomenon in the obtained ceramic sintered body occurs.

Furthermore, where the width of the coil conductor is increased to reduce the direct current resistance, the inductance is substantially lowered.

Not only in laminated inductors, but also in laminated ceramic electronic components, such as monolithic ceramic capacitors, similar problems occur. That is, when the number of laminated layers of the inner electrode is increased, the distortion due to the adhesion by pressing increases, and the aforementioned delamination occurs. When the thickness of the inner electrode is increased to lower the direct current resistance, the aforementioned delamination occurs even more often.

SUMMARY OF THE INVENTION

To overcome the above-described problems with the prior art, preferred embodiments of the present invention provide a manufacturing method for a laminated ceramic electronic component and a laminated ceramic electronic component, wherein the thickness of the inner electrode is easily increased, and even when the number of laminated layers of the inner electrode is increased, the aforementioned delamination does not occur.

Preferred embodiments of the present invention further provide a manufacturing method for a laminated inductor, wherein the thickness of the coil conductor defining the inner electrode is easily increased, and even when the number of laminated layers of the inner electrode is increased, delamination does not occur, and furthermore, a greatly increased inductance is easily obtained.

According to a first preferred embodiment of the present invention, a manufacturing method for the laminated ceramic electronic component includes a process wherein a ceramic paste is printed on a carrier film except for a portion on which an inner electrode is provided, a process wherein an inner electrode paste is printed on the portion of the aforementioned carrier film, on which the inner electrode is provided, such that a green sheet defined by the ceramic paste layer and the inner electrode paste layer is produced, a process wherein the green sheet is laminated by repeating the process in which a laminate of the green sheet and the carrier film is adhered by pressing to another green sheet on a lamination stage, and thereafter the carrier film is peeled off to yield a ceramic laminate, and a process wherein the aforementioned ceramic laminate is fired to obtain a ceramic sintered body. Herein, the "another green sheet" may or may not include an inner electrode paste layer.

In a specific aspect of the manufacturing method for the laminated ceramic electronic component according to the first preferred embodiment, the aforementioned printing process for the ceramic paste is executed after the aforementioned printing process for the inner electrode paste.

In another specific aspect of the manufacturing method for the laminated ceramic electronic component according to the first preferred embodiment, the aforementioned printing process for the ceramic paste is executed before the aforementioned printing process for the inner electrode paste.

In another specific aspect of the manufacturing method for the laminated ceramic electronic component according to the first preferred embodiment, a process, wherein plural layers of the aforementioned green sheet, on which inner electrode paste layers having substantially the same shape are provided, and which are supported by a carrier film, are laminated and adhered by pressing to another green sheet on the lamination stage, and thereafter the carrier film is peeled off, and this is repeated a plurality of times to form an inner electrode having a thickness matching the entirety of laminated plural inner electrode paste layers.

According to the second preferred embodiment of the present invention, a manufacturing method for the laminated ceramic electronic component includes a process wherein first and the second composite sheets are prepared and supported on a carrier film, and in which an inner electrode paste layer and a ceramic green sheet layer are formed such that the inner electrode paste layer penetrates both primary surfaces of the ceramic green sheet layer; a process wherein the first composite sheet is laminated and adhered by pressing to another green sheet on the lamination stage, and thereafter the carrier film is peeled off; a process wherein the second composite sheet is laminated and adhered by pressing to the first composite sheet, and thereafter the carrier film laminated on the second composite sheet is peeled off, and thereby an inner electrode is formed in which the inner electrode paste layers of the first and the second composite sheets are laminated; and a process wherein the laminate obtained by the aforementioned laminating process is sintered to obtain a ceramic sintered body.

According to a third preferred embodiment of the present invention, a manufacturing method for the laminated ceramic electronic component includes a process wherein a plurality of layers of electrode green sheet are prepared which are supported on a carrier film, and in which a ceramic layer is provided surrounding an inner electrode defining an inductance such that the inner electrode defining the inductance penetrates the top surface and the bottom surface of the ceramic layer; a process wherein at least a layer of a connection electrode green sheet is provided which is supported on a carrier film, and in which a ceramic layer is provided surrounding the connection electrode such that the connection electrode is exposed at the top surface and the bottom surface of the ceramic layer; a process wherein the electrode green sheet and the connection electrode green sheet are laminated to produce a laminate while being peeled from the carrier film such that the inner electrode defining the inductor is electrically connected via the aforementioned connection electrode to define a coil; and a process wherein the aforementioned laminate is fired to obtain a ceramic sintered body.

In a specific aspect of the manufacturing method for the laminated ceramic electronic component according to the third preferred embodiment, a plurality of layers of the aforementioned electrode sheet, on which the inner electrodes which define an inductor in substantially the same shape are provided, are laminated to define an inner electrode over a plurality of layers.

In another specific aspect of the manufacturing method for the laminated ceramic electronic component according to the third preferred embodiment, in the aforementioned laminating process, the aforementioned carrier film is peeled off after adhering the electrode green sheet and the connection electrode green sheet by pressing.

The fourth preferred embodiment of the present invention is a manufacturing method for the laminated ceramic electronic component, including a process wherein an electrode green sheet is prepared, which is supported on a carrier film, and in which a ceramic layer is provided surrounding an inner electrode to define an inductor such that the inner electrode defining the inductor is exposed at the top surface and the bottom surface of the ceramic layer; a process wherein the aforementioned green sheet is laminated to obtain a laminate, while peeling the carrier film such that the inner electrodes are electrically connected to each other to define a coil conductor; and a process wherein the aforementioned laminate is fired to obtain a ceramic sintered body.

In the specific aspect of the manufacturing method of the laminated ceramic electronic component according to the fourth preferred embodiment, the aforementioned carrier film is peeled off after adhering the aforementioned electrode green sheet by pressing.

In another specific aspect of the manufacturing method for the laminated ceramic electronic component according to the fourth preferred embodiment, a plurality of layers of the electrode green sheet, on which the inner electrodes which define an inductor in substantially the same pattern are provided, are directly laminated to define an inner electrode over the plurality of layers.

A manufacturing method for the laminated ceramic electronic component according to a fifth preferred of the present invention includes a process wherein a plurality of layers of electrode green sheet to define an inductor are prepared, which are supported on a carrier film, and in which a ceramic layer is provided surrounding an inner electrode to define the inductor such that the inner electrode to define the inductor penetrates the top surface and the bottom surface of the ceramic layer; a process wherein a plurality of layers of electrode green sheet defining a capacitor are prepared, which are supported on a carrier film, and in which a ceramic layer is provided surrounding an inner electrode defining the capacitor such that the inner electrode defining the capacitor penetrates the top surface and the bottom surface of the ceramic layer; a process wherein a plain ceramic green sheet supported on a carrier film is prepared; and a process including the first laminating process, in which the aforementioned electrode green sheet defining the inductor is laminated while being peeled from the carrier film such that the plurality of layers of inner electrode defining the inductor are electrically connected in the direction of the lamination to define a coil, and the second laminating process, in which the aforementioned electrode green sheet defining the capacitor and the aforementioned plain green sheet are laminated while being peeled from the carrier film such that the plurality of layers of electrode green sheet defining the capacitor are laminated interposing the plain green sheet, wherein the laminate, obtained by executing the aforementioned first and second laminating processes in order or in reverse order, is fired to yield a ceramic sintered body.

According to the fifth preferred embodiment, the ceramic sintered body is obtained by sintering the laminate obtained by executing the aforementioned first and second laminating processes in order or in reverse order, and in the ceramic sintered body, an inductance unit including the coil defined by connecting the inner electrode defining the inductor, and a capacitor unit defined by facing the aforementioned plurality of inner electrodes for the capacitor interposing the ceramic layer are integrated. Therefore, an integrated LC component is achieved according to the present invention.

In a specific aspect according to the fifth preferred embodiment, a magnetic ceramic is used as the ceramic layer used in the aforementioned electrode green sheet defining the inductor, and a dielectric ceramic is used as the ceramic layer used in the aforementioned electrode green sheet defining the capacitor.

In another specific aspect according to the first to fifth preferred embodiments, in the process for obtaining the aforementioned laminate, at least a layer of plain ceramic green sheet prepared separately by a sheet manufacturing method is laminated on the outermost layer.

According to a sixth preferred embodiment of the present invention, a laminated ceramic electronic component using a ceramic sintered body obtained by integrally firing a plurality of ceramic layers together with an inner electrode including a ceramic sintered body and an inner electrode disposed in the aforementioned ceramic sintered body, wherein the aforementioned inner electrode has a thickness matching the entirety of the aforementioned plural ceramic layers, is provided.

In a specific aspect of the laminated ceramic electronic component according to the sixth preferred embodiment, plural inner electrodes are provided and electrically connected in the ceramic sintered body.

In another specific aspect of the laminated ceramic electronic component according to the sixth preferred embodiment, the aforementioned plural inner electrodes are electrically connected via a connection inner electrode.

In another specific aspect of the laminated ceramic electronic component according to the sixth preferred embodiment, when the width and the thickness of the aforementioned inner electrode are W and T, respectively, the ratio T/W is approximately 0.2 or more.

Other features, elements, characteristics and advantages of the present invention will become more apparent from the detailed description of preferred embodiments thereof with reference to the drawings.

DETAILED DESCRIPTION OF PREFERRED EMBODIMENTS

Specific preferred embodiments of the manufacturing method for the laminated ceramic electronic portion and the laminated ceramic electronic portion according to the present invention will be explained below with reference to the drawings.

A manufacturing method for the laminated inductor according to the first preferred embodiment of the present invention will be explained with reference to FIG. 1 to FIG. 6.

Figure 2A:
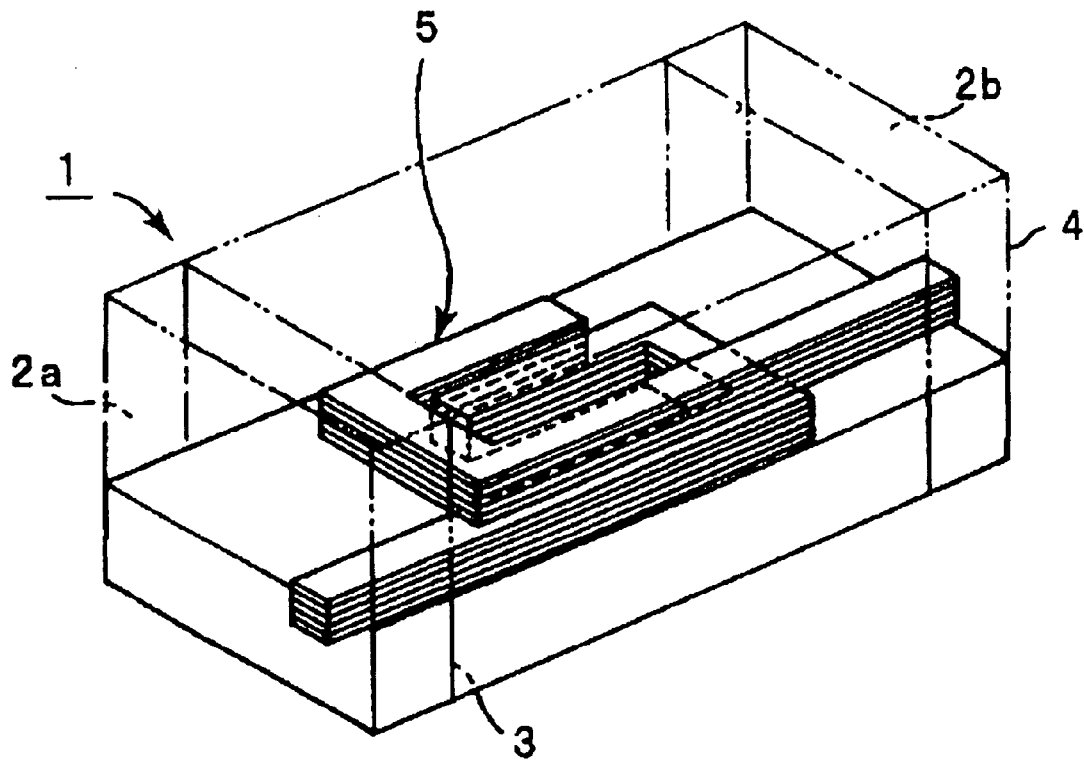
FIGS. 2A and 2B are drawings illustrating a laminated inductor according to a preferred embodiment of the present invention, wherein 2A is a perspective transparent schematic drawing of a coil conductor showing the inside thereof, and 2B is a perspective view thereof.
Figure 2B:
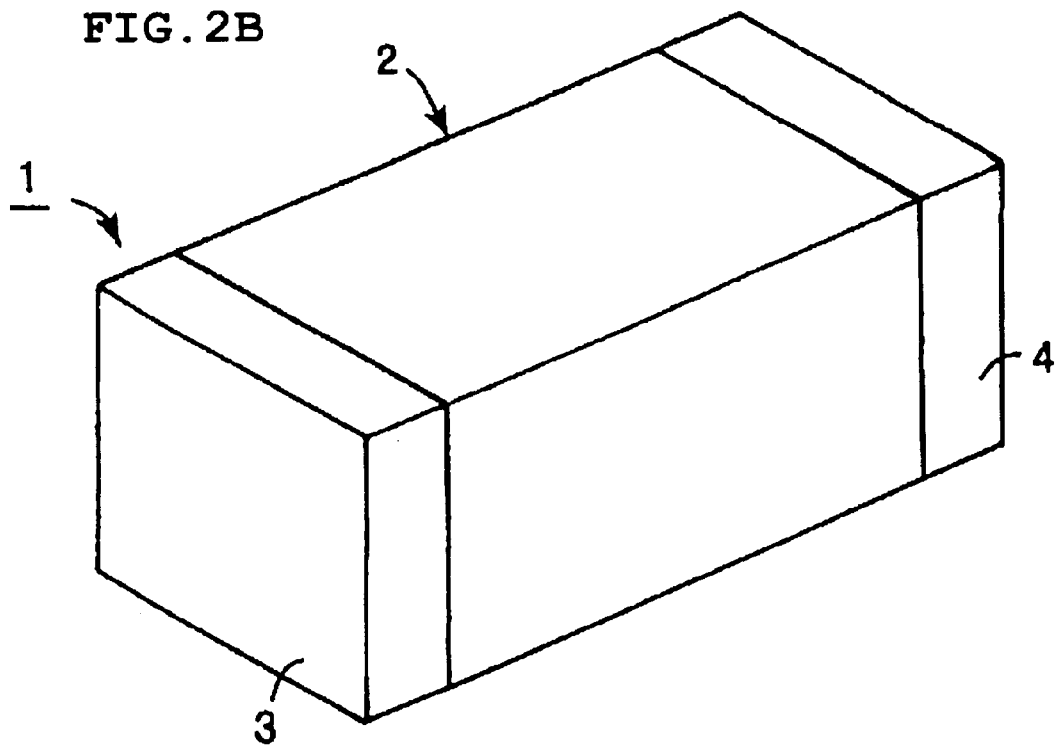

FIGS. 2A and 2B are a perspective view and a perspective appearance view showing the outline of the internal structure of a laminated inductor according to the first embodiment of the present invention.

A laminated inductor 1 includes a ceramic sintered body 2 in the shape of a rectangular parallelepiped. The ceramic sintered body 2 is defined by a magnetic ceramic, for example, ferrite, or an insulating ceramic, for example, a glass ceramic. Preferably, a magnetic ceramic is used.

The first and the second outer electrodes 3 and 4 are provided to cover the first and the second end surfaces 2a and 2b of the ceramic sintered body 2. A coil 5 is provided in the ceramic sintered body 2. As shown in FIG. 2A, an end of the coil 5 is exposed on the end surface 2a, and is electrically connected to the outer electrode 3. The other end of the coil 5 is exposed on the end surface 2b, and is electrically connected to the outer electrode 4.

Figure 1A:
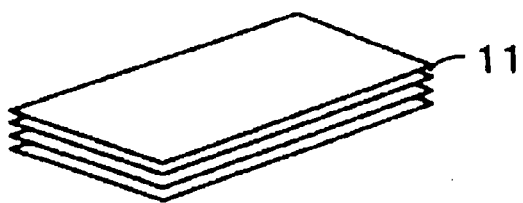
FIGS. 1A to 1C are a perspective assembly drawing, a plan view, and a sectional view along the line B—B in FIG. 1B illustrating a green sheet for producing a laminated inductor according to ad preferred embodiment of the present invention, and an inner electrode layer and a ceramic paste layer.

In the manufacture of the laminated inductor 1, green sheets 11 to 15 shown in FIG. 1A are laminated. Herein, the green sheets 11 and 15 are the ceramic green sheets defining the uppermost and the lowermost ceramic sintered body layers, and the green sheets 12 to 14 are the green sheets defining the ceramic layer and the coil conductor 5, in the portion where the coil conductor 5 is provided.

Figure 1B:
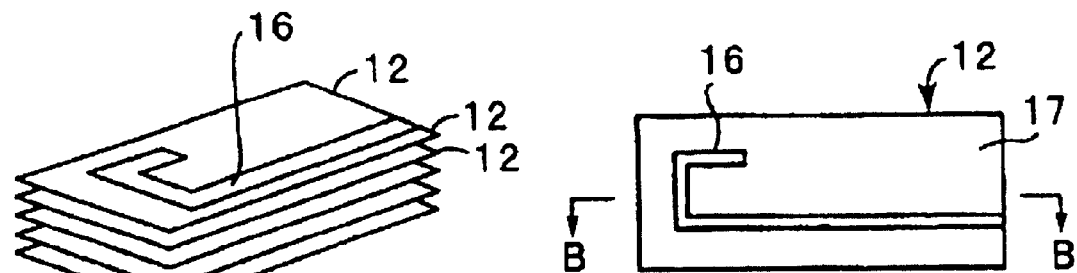
Figure 1C:
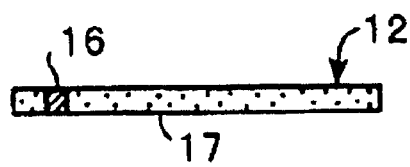
Figure 1C:
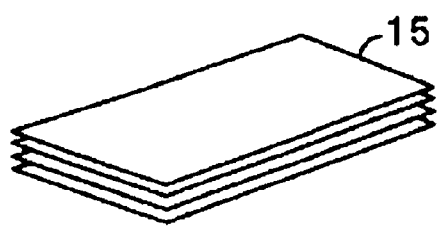

As shown in FIGS. 1B and 1C, the green sheet 12 is composed of an inner electrode paste layer 16 in a substantially a square bracket (]) shape or a hook shape defining the coil conductor 5, and a ceramic paste layer 17 is provided surrounding the inner electrode paste layer 16. The inner electrode paste layer 16 is provided to penetrate the green sheet 12 from the top surface to the bottom surface. As shown in FIG. 1A, a plurality of layers of the green sheet 12 are laminated to face in the same direction. Therefore, a plurality of inner electrode paste layers 16 are stacked in the direction of the thickness to define a coil conductor component having a large thickness, that is, an inner electrode.

In the present preferred embodiment, the thickness of the green sheet 12 is about 20 $\mu$m, and the width of the inner electrode paste layer 16 is about 100 $\mu$m, and therefore, five layers of green sheet 12 are laminated to define an inner conductor with an aspect ratio of 1.

The green sheet 13 includes an inner electrode paste layer 18 and a ceramic paste layer 19. The inner electrode paste layer 18 is in the shape of a rectangle. The inner electrode paste layer 18 is also provided to penetrate the green sheet 13 from the top surface to the bottom surface.

The green sheet 14 includes an inner electrode paste layer 20 in a substantially square bracket shape (]) and a ceramic paste layer 21. The inner electrode paste layer 20 is provided to penetrate the green sheet 14 from the top surface to the bottom surface, in a manner very similar to that of the inner electrode paste layer 16. In the present preferred embodiment, plural layers of the green sheet 14 are laminated to face in the same direction. Therefore, plural inner electrode paste layers 20 are laminated to define a coil conductor part of large thickness, that is, an inner electrode.

The inner electrode paste layer 18 is disposed to define a connection inner electrode for electrically connecting the inner electrode paste layer 16 being laminated in the upper portion and the inner electrode paste layer 20 being laminated in the lower portion.

In the green sheets 12 to 14, however, the inner electrode paste layers 16, 18, and 20 are provided to penetrate the green sheets 12 to 14 from the top surface to the bottom surface. Therefore, these cannot be obtained by a method of coating a conductive paste on a green sheet.

Figure 3A:
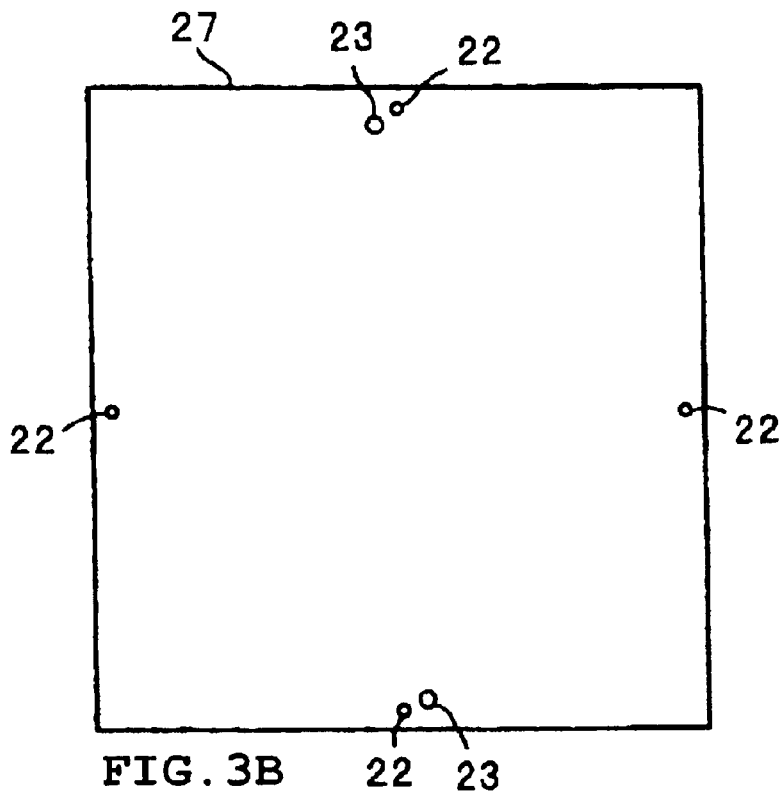
FIGS. 3A and 3B are plan views showing a carrier film used in the first preferred embodiment, and a state wherein an inner electrode layer and a ceramic paste layer are formed on the carrier film, respectively.

In the present preferred embodiment, before laminating the green sheets 11 to 15, a mother carrier film 27 shown in FIG. 3A is prepared. The carrier film 27 is made of a synthetic resin, for example, polyethylene terephthalate, or other suitable synthetic resin. In the present preferred embodiment, the carrier film 27 is in the shape of a square, and alignment holes 22 for printing are provided in the approximate center of each edge thereof. Alignment holes 23 for laminating are provided near the alignment holes 22 for printing.

An inner electrode paste layer 24 and a ceramic paste layer 25 are provided on the carrier film 27.

Figure 3B:
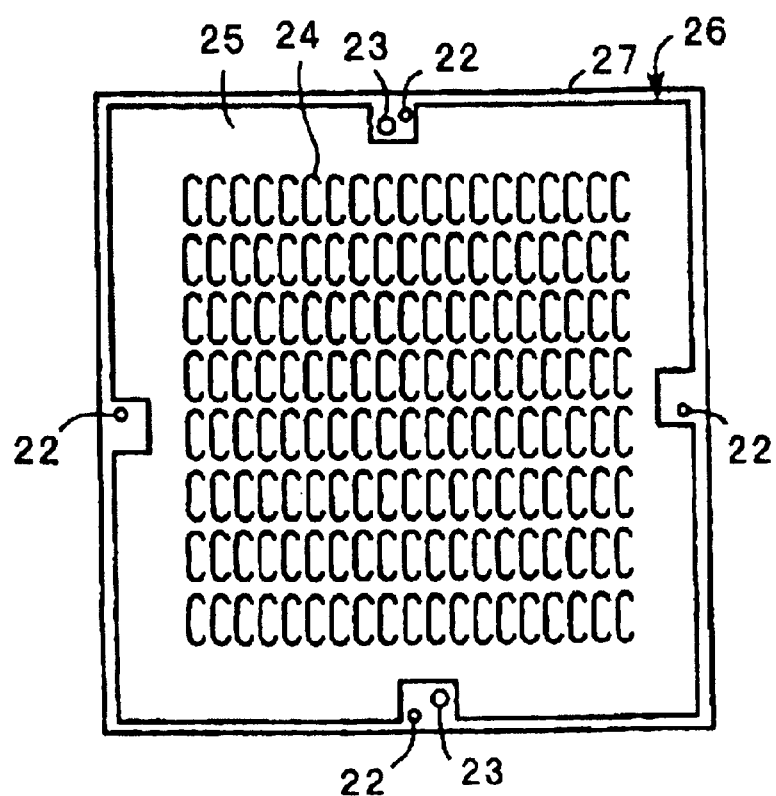

In FIG. 3B, the inner electrode paste layer 24 in a shape defining a portion of the coil conductor is schematically shown. This inner electrode paste layer 24 corresponds to the inner electrode paste layers 16, 18, and 20 shown in FIG. 1, and is shaped in accordance with the planar shape of the desired inner electrode paste layer. Then, after forming the inner electrode paste layer 24, a ceramic paste layer 25 is provided in the surrounding area thereof.

The inner electrode paste layer 24 may also be formed after providing the ceramic paste layer 25.

As described above, a structure in which the green sheet 26 is supported by the carrier film 27 is obtained.

Figure 4A:
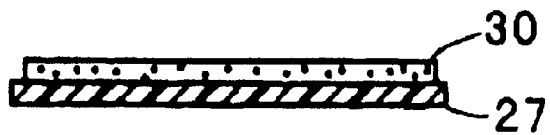
FIGS. 4A to 4C are sectional views illustrating a process for the lamination of green sheet supported by a carrier film in a preferred embodiment of the present invention.

As shown in FIG. 4A, a mother green sheet 30 for producing the green sheets 11 and 13 not having the inner electrode paste layer therein is supported on the carrier film 27 in a manner similar to that in the above description.

Figure 4B:
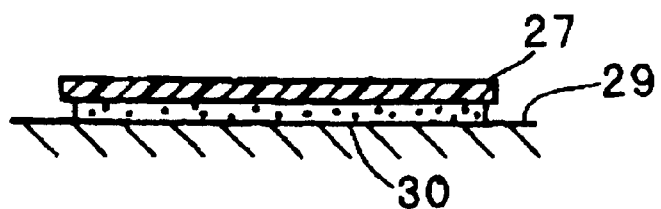

Then, as shown in FIG. 4B, a lamination stage 29 is prepared. The green sheet 30 supported by the carrier film 27 is disposed on the lamination stage 29 with the green sheet 30 facing downward. This green sheet 30 is made of only the ceramic paste and includes no inner electrode paste layer. At this time, the alignment holes 23 for laminating are detected by a camera (not shown in the drawings) and the location of the green sheet 30 is determined.

Thereafter, the green sheet 30 is adhered by pressing from the outer surface side of the carrier film 27, and thereafter the carrier film 27 is peeled from the green sheet 30.

Figure 4C:
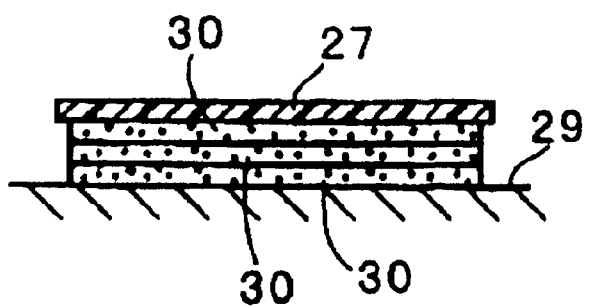

As described above, by repeating the lamination and adhesion by pressing the green sheet 30 supported by the carrier film 27, on the lamination stage 29, plural layers of mother green sheet 30 are laminated as shown in FIG. 4C.

Figure 5A:
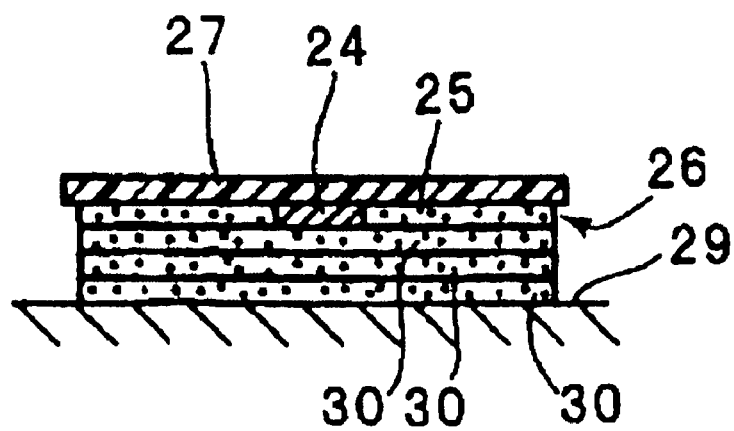
FIGS. 5A and 5B are sectional views illustrating a process for the lamination of a green sheet supported by a carrier film in a preferred embodiment of the present invention.
Figure 5B:
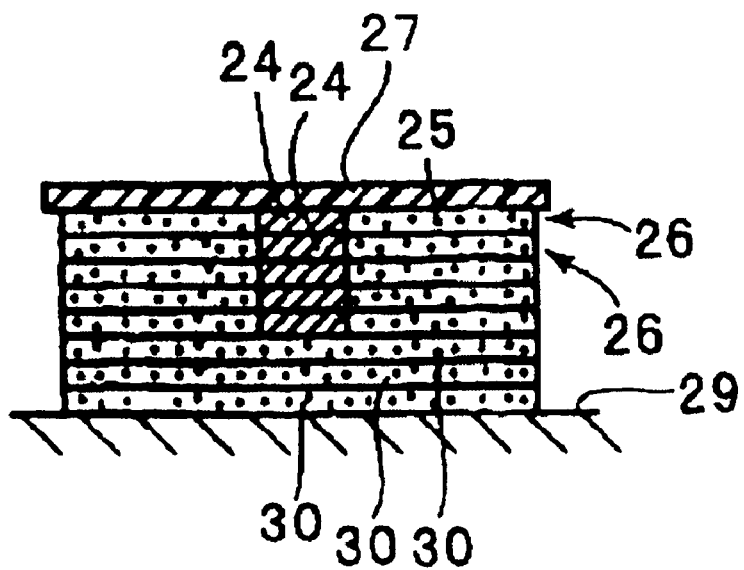

Furthermore, as shown in FIGS. 5A and 5B, the green sheet 26 including the inner electrode paste layer 24 and the ceramic paste layer 25 is supported on the carrier film 27 and is laminated in a manner similar to that of the above description, one after another.

The determination of the location during the lamination can be made not only by the location determination method using the image processing of the alignment holes with a camera, as in the preferred embodiment, but also in accordance with known methods such as location determination methods based on the end faces of the carrier film, and by the use of the pins.

Thus, a laminate is obtained by laminating a plurality of layers of the green sheet and then pressing the obtained laminate in the direction of the thickness. The mother laminate obtained as described above is cut in the direction of the thickness into laminates of individual laminated inductor units, and the laminates are fired to obtain the ceramic sintered body 2.

Therefore, the green sheets 12 to 14, in which the inner electrode paste layers 16, 18, and 20 are provided to penetrate the top surface and the bottom surface thereof, are treated in a state of being supported by the carrier film 27, and are laminated as described above so that the laminate, for producing the ceramic sintered body 2 shown in FIG. 2, is easily obtained.

The green sheets 30 having no inner electrode paste layer which are laminated on the uppermost portion and the lowermost portion need not be supported by the carrier film.

That is, the green sheet defining the outermost portion of the ceramic laminate may be obtained using the green sheet obtained by the sheet manufacturing method, for example, by a doctor blade method, a roll coater method, a die coater method, a pull method, or other suitable methods. In these cases, the ceramic green sheet may be laminated by a transfer method in a state supported by the carrier film 27, or a green sheet of large thickness may be prepared for treatment in a state being peeled from the carrier film, etc., and may be laminated.

With reference to FIGS. 2A and 2B again, in the laminated inductor 1 according to the present preferred embodiment, as described above, the ceramic sintered body 2 including the coil conductor 5 is easily obtained by an integral firing technique for laminated ceramics. The coil conductor 5 is defined by the inner electrode paste layers 16 and 20 provided to have thicknesses to penetrate the green sheets 12 and 14 from the top surface to the bottom surface. Because a plurality of layers of the inner electrode paste layers 16 and 20 are laminated, respectively, the coil conductor 5 of large thickness is easily produced. Therefore, a large inductance is easily obtained.

Furthermore, because the inner electrode paste layers 16 and 20 defining the coil conductor 5 as described above, have the same thickness as the green sheets 12 and 14, the distortion in the mother laminate caused during the adhesion by pressing in the direction of the thickness is greatly reduced. Therefore, it is possible to reliably prevent delamination in the obtained ceramic sintered body 2 from occurring.

As in the present preferred embodiment, by laminating a plurality of layers of the inner electrode paste layers 16 and 20, respectively, a coil conductor 5 having a large thickness is produced. In this case, when the width and the thickness of the inner electrode defining the coil conductor 5 is indicated by W and T, respectively, an inner electrode having a ratio T/W of at least about 0.2 is easily obtained. Herein, the inner electrode defining the coil conductor 5 means the coil conductor portion defined by laminating the plurality of layers of the inner electrode paste layers 16. In the conventional manufacturing method for the laminated ceramic electronic component, because the inner electrode is formed by printing the conductive paste on the ceramic green sheet, the inner electrode with such a large T/W can not be produced. In contrast, according to the present invention, as described above, by laminating the green sheet on which the ceramic sheet is provided surrounding the inner electrode paste, an extremely thick inner electrode having a ratio of T/W of at least about 0.2 is easily produced.

Figure 6:
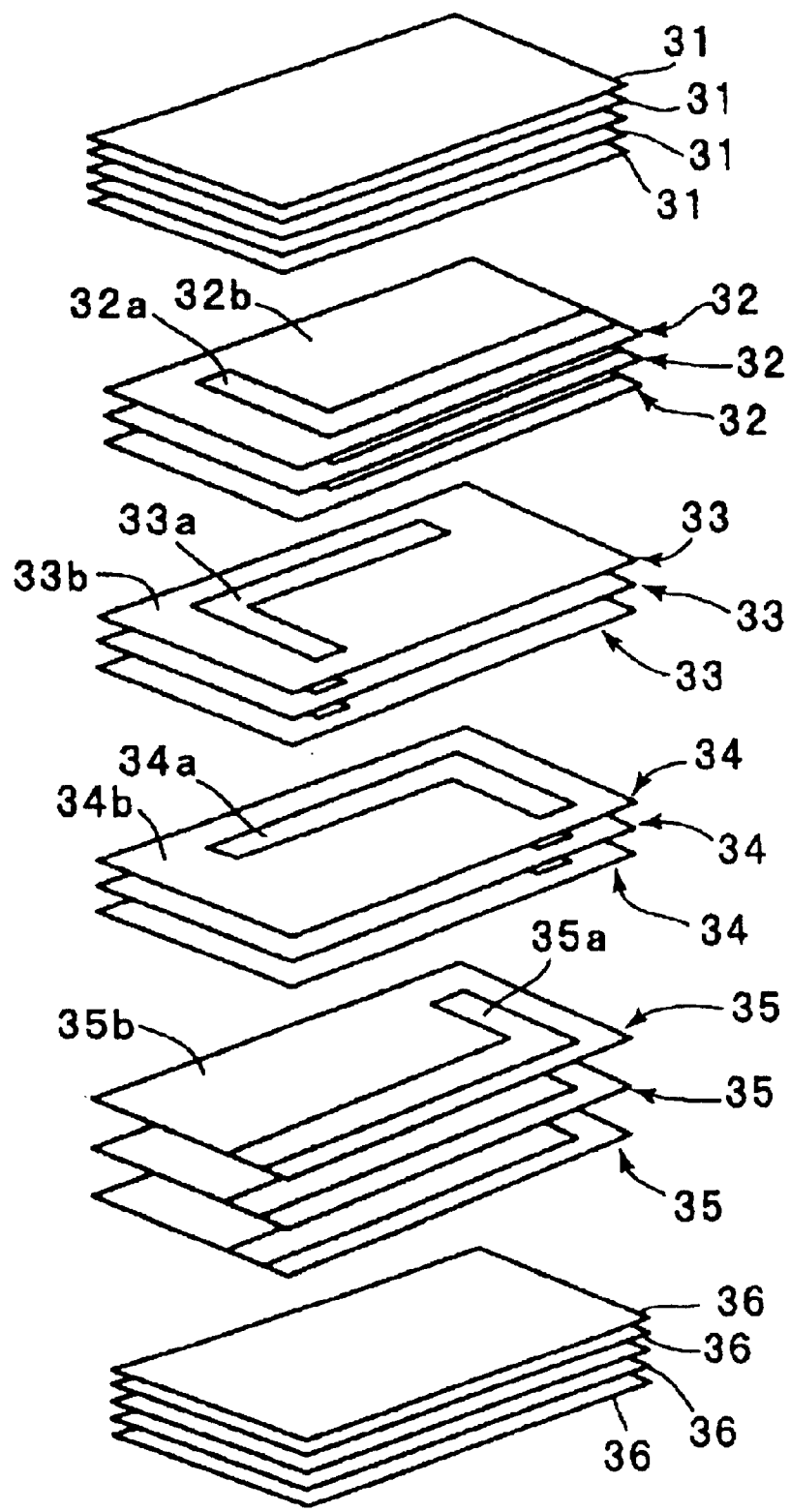
FIG. 6 is a perspective assembly drawing illustrating a modified embodiment of a manufacturing method for the laminated inductor according to a preferred embodiment of the present invention.
Figure 7:
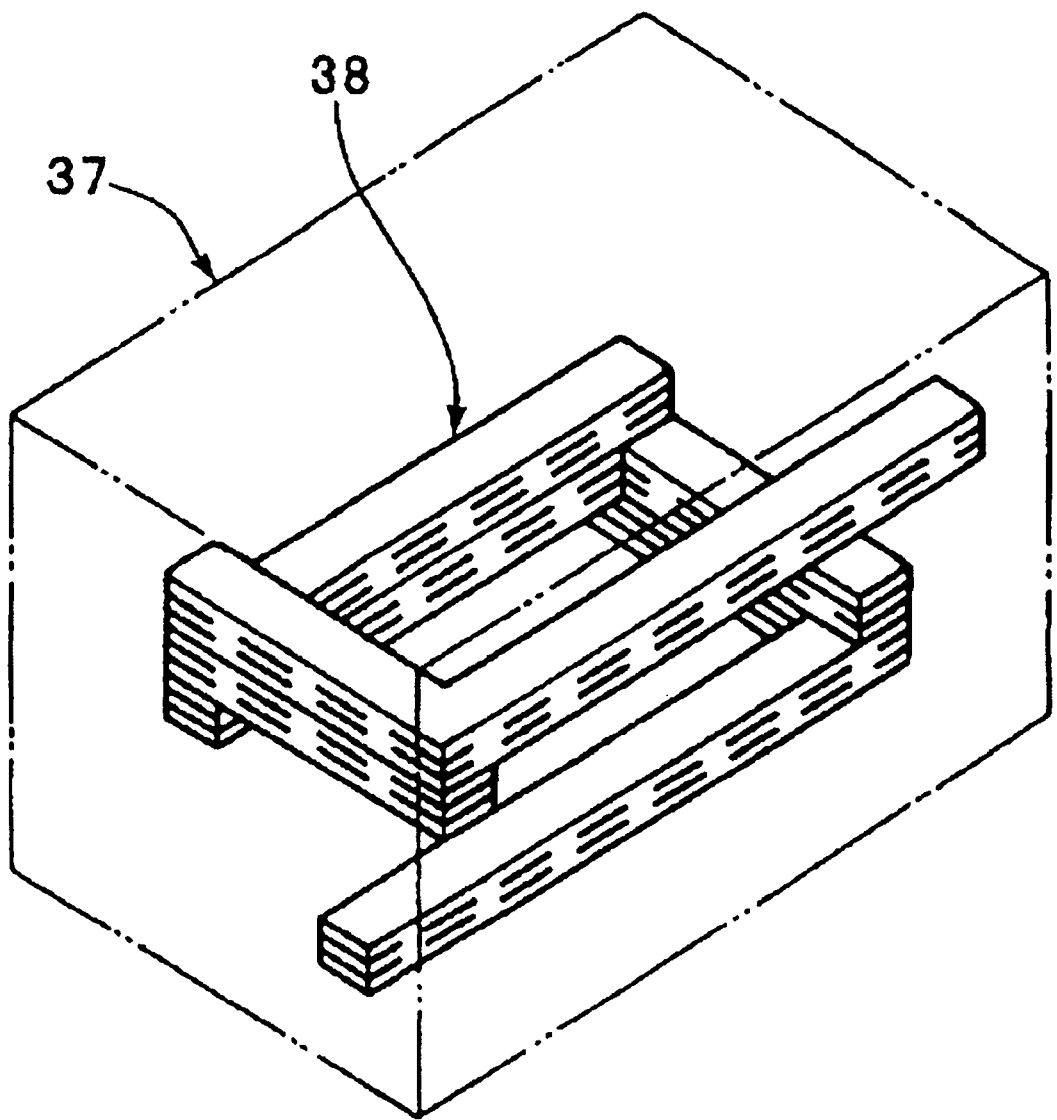
FIG. 7 is a perspective schematic drawing of the inside of a coil conductor of a ceramic sintered body obtained by laminating and firing plural layers of green sheet shown in FIG. 6.

FIG. 6 and FIG. 7 are drawings for explaining a laminated inductor according to a modified embodiment of the first preferred embodiment.

In the present modified embodiment, as shown in FIG. 6, ceramic green sheets 31 to 36 are laminated. The ceramic green sheets 31 and 36 include no inner electrode paste layers, and are formed of only the ceramic paste layers. Green sheets 32 to 35 include inner electrode paste layers 32a to 35a, and ceramic paste layers 32b to 35b. The green sheets 32 to 35 are laminated in a plurality of layers, respectively, as shown in FIG. 7. Therefore, the inner electrode paste layers 32a to 35a are also laminated in a plurality of layers.

Furthermore, in laminating the inner electrode paste layers 32a to 35a as shown in FIG. 6, an end side portion of the upper inner electrode paste layer is in contact with an end side portion of the lower inner electrode paste layer by stacking an edge thereof one on the other. For example, in FIG. 6, the inner electrode paste layer 32a in the green sheet 32, located at the lowermost portion among the plurality of green sheets 32, is stacked to the inner electrode paste layer 33a in the lower green sheet 33 such that the inner electrode paste layer 32a overlaps the inner electrode paste layer 33a at an edge of the rectangular winding path.

The green sheets 31 to 36 are, as in the first preferred embodiment, laminated and pressed in the direction of the thickness to obtain a ceramic sintered body 37 as schematically shown in FIG. 7. In the ceramic sintered body 37, a coil conductor 38 is provided. The coil conductor 38 is produced by baking the inner electrode paste layers 32a to 35a such that a rectangular winding path is obtained when viewed from above. As described above, because the upper coil conductor portion and the lower coil conductor portion are directly stacked in the direction of the thickness to connect to each other at an edge of the rectangular winding path, the reliability of electrical connection between each coil conductor portion is greatly improved in the modified embodiment shown in FIG. 6 and FIG. 7, In the manufacturing method for the laminated inductor according to the present invention, the connection inner electrode paste layer is not necessarily provided.

In the laminated inductor obtained according to the modified embodiment shown in FIG. 6 and FIG. 7, because the thickness of the coil conductor 38 is also increased as described above, a large inductance is easily obtained, and distortion in the ceramic sintered body 37 does not occur during the adhesion by pressing so that delamination is greatly suppressed.

In the first preferred embodiment and in the above mentioned modified embodiment, a plurality of layers of inner electrode paste layers having the same pattern are laminated to define a coil conductor have a large thickness; the inner electrode paste layer defining a portion of the coil conductor may, however, be a single layer. For example, in the first preferred embodiment, only one layer of the green sheets 12 and 14 may be used, respectively, and the coil conductor may be defined by a layer of the inner electrode paste layer 16, a layer of the inner electrode paste layer 18 for a connection electrode, and a layer of the inner electrode paste layer 20. Even in such a case, because the coil conductor having a thickness substantially equivalent to the thickness of the green sheet is provided, although the current-carrying capacity is less than that of the first preferred embodiment and the above mentioned modified embodiment, a coil conductor having larger thickness as compared with the conventional conductor formed by coating the conductive paste one time on the green sheet, is easily obtained. Such a constitution is also covered by the present invention.

Figure 8:
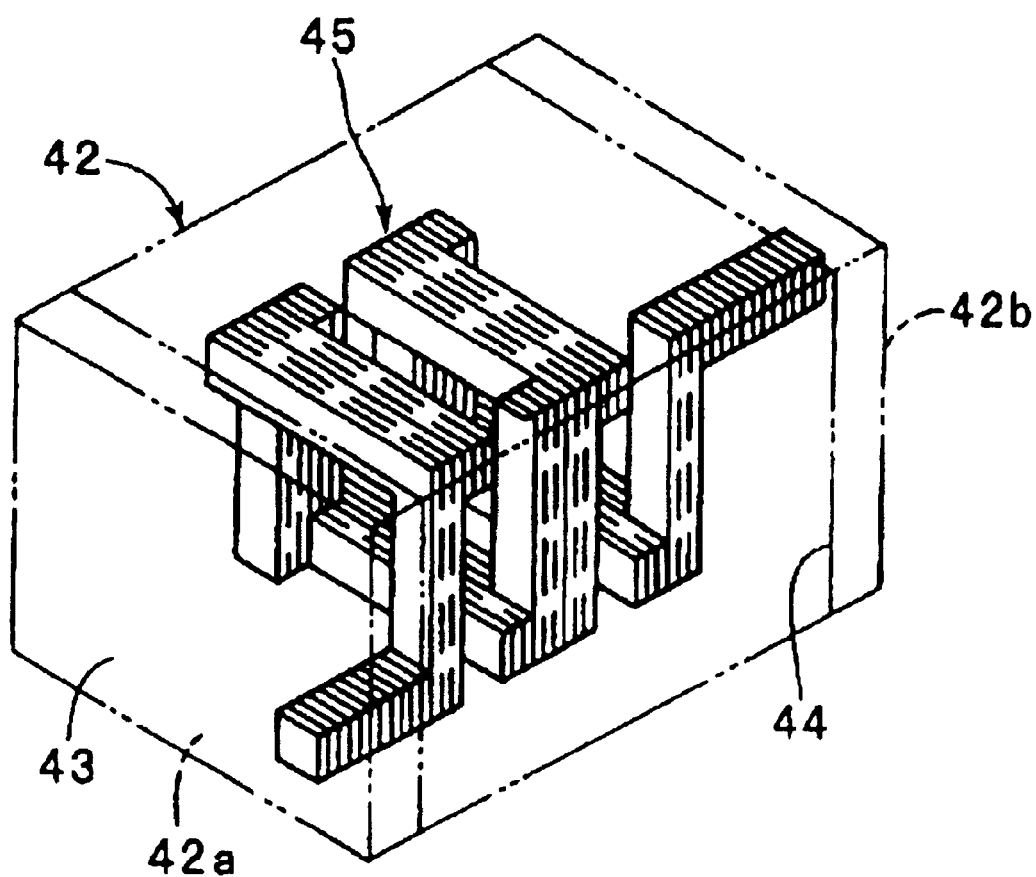
FIG. 8 is a perspective schematic drawing illustrating another preferred embodiment of a laminated inductor according to the present invention.

In the first preferred embodiment, the outer electrodes 3 and 4 are provided on the end surfaces 2a and 2b of the ceramic sintered body 2, and the coil conductor 5 is wound from the top surface 2c toward the bottom surface 2d. As shown in FIG. 8, however, a so-called horizontal winding type laminated inductor 41 may be provided, in which outer electrodes 43 and 44 are provided on the end surfaces 42a and 42b of the ceramic sintered body 42, and the coil conductor 45 is wound from the end surface 42a toward the end surface 42b.

Figure 9:
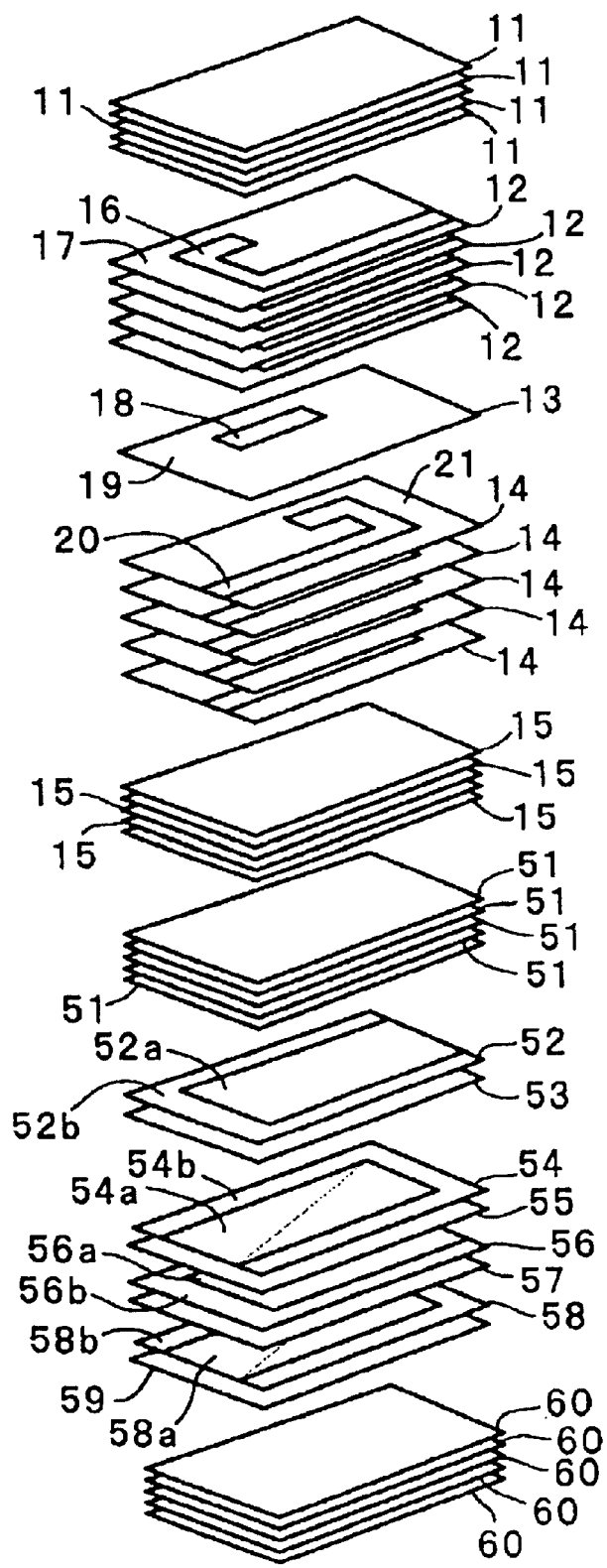
FIG. 9 is a perspective assembly drawing illustrating a manufacturing method for a laminated LC portion according to the second preferred embodiment of the present invention.

FIG. 9 is a perspective assembly drawing for explaining a manufacturing method of a laminated LC component according to a second preferred embodiment of the present invention. In the present preferred embodiment, the green sheets 11 to 15 are laminated to define the inductance unit in a manner similar to that in the first preferred embodiment. The green sheets 11 to 15 are configured in the same manner as in the first preferred embodiment. Therefore, regarding the construction of the green sheets 11 to 15 and the laminating process of the green sheets 11 to 15, explanations thereof are omitted because the explanations of the first preferred embodiment apply in a similar manner.

In the present preferred embodiment, the green sheets 51 to 60 are laminated to further define the capacitor unit under the green sheet 15. Herein, the green sheets 51 and 60 define the outer layer portions of the capacitor unit, are prepared in a manner similar to that for the green sheets 11 and 15, and are laminated.

The green sheet 11 and the green sheet 60 defining the outermost layer portions of the overall laminate, may be separately prepared using a sheet manufacturing method, for example, a doctor blade method or other suitable method, and may be laminated as described above. That is, a process in which the green sheet supported by a carrier film is transferred by a transfer method is not necessarily used.

On the other hand, the green sheets 52 to 59 are laminated, similarly to the green sheets 12 to 14, by laminating the green sheet supported by a carrier film using a transfer method, in a manner similar to that in the first preferred embodiment.

Herein, the green sheets 52, 54, 56, and 58 include inner electrodes 52a, 54a, 56a, and 58a to define the capacitor, and ceramic layers 52b, 54b, 56b, and 58b are provided in the surrounding area thereof, respectively. That is, in the green sheets 52, 54, 56, and 58 defining the capacitor, the inner electrodes 52a, 54a, 56a, and 58a defining the capacitor have the same thickness as the green sheets 52, 54, 56, and 58. Such inner electrodes 52a, 54a, 56a, and 58a are provided in the same manner as that of the inner electrode paste layer 16 defining the inductor in the first preferred embodiment.

In the case in which the capacitor is provided, because the upper and the lower electrodes must be separated by interposing ceramic layers, plain ceramic green sheets 53, 55, and 57 are interposed between the green sheets 52, 54, 56, and 58 defining the capacitor, respectively.

In the present preferred embodiment, subsequent to the initial laminating process wherein the aforementioned green sheets 11 to 15 are laminated to define the inductance unit, or before the initial laminating process, the second laminating process, wherein the green sheets 51 to 60 defining the capacitor unit are laminated, is executed.

In the second laminating process, similarly to the case in which the green sheet 12 is prepared in the first preferred embodiment, the green sheets 52, 54, 56, and 58 supported by the carrier film, and the plain ceramic green sheets 53, 55, and 57, also supported by the carrier film, are laminated. Thus, in the second laminating process, the capacitor unit portion is laminated.

By way of the first and the second laminating processes, a laminate in which the inductance unit and the capacitor unit are integrally provided is obtained. This laminate is fired to yield a ceramic sintered body, and by providing a plurality of outer electrodes on the outer surface of the ceramic sintered body, a laminated LC component is obtained.

As the ceramic for the green sheets 11 to 15 used in the first laminating process, a magnetic ceramic is preferably used, and thereby a greatly increased inductance is obtained. As the ceramic material on the green sheets 51 to 60 defining the capacitor unit, a dielectric ceramic is preferably used, and thereby, in the capacitor unit, a greatly increased capacitance is obtained.

The green sheets 11 to 15, however, may be made of a dielectric ceramic instead of a magnetic ceramic.

Figure 10:
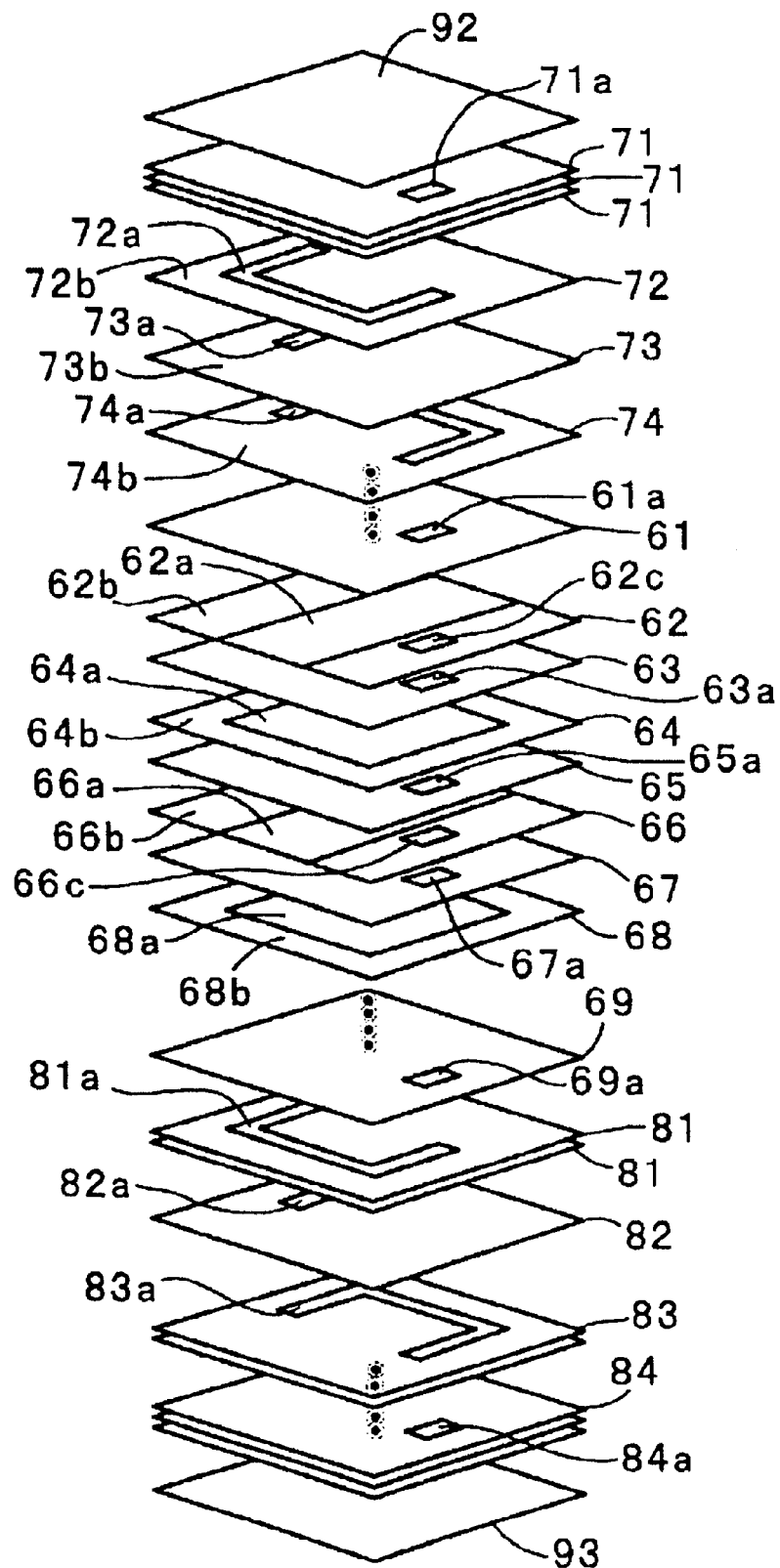
FIG. 10 is a perspective assembly drawing illustrating a laminated LC part according to a third preferred embodiment of the present invention.

FIG. 10 is a perspective assembly drawing for illustrating a third preferred embodiment of a laminated LC component according to the present invention.

In the second preferred embodiment, the capacitor unit was provided below the inductance unit; the inductance units, however, may be disposed above and below the capacitor unit.

That is, in the third preferred embodiment, to provide the capacitor unit, the green sheets 61 to 69 are laminated. Among these, the green sheets 62, 64, 66, and 68 include inner electrodes 62*a*, 64*a*, 66*a*, and 68*a* defining the capacitor, penetrating from the top surface to the bottom surface thereof, and ceramic layers 62*b*, 64*b*, 66*b*, and 68*b* are provided in the surrounding area of the inner electrodes 62*a*, 64*a*, 66*a*, and 68*a*. To prevent short-circuiting of the upper and lower inner electrodes, the green sheet 63 is laminated between the green sheets 62 and 64, the green sheet 65 is laminated between the green sheets 64 and 66, and the green sheet 67 is laminated between the green sheets 66 and 68.

In the present preferred embodiment, upper and lower inductance units are provided, and to connect the upper and the lower inductance units, connection electrodes 61*a*, 63*a*, 65*a*, and 67*a* are provided in the green sheets 61, 63, 65, and 67, and furthermore, connection electrodes 62*c* and 66*c* are provided in the green sheets 62 and 66. That is, the connection electrode 61*a* is electrically connected to a coil conductor of the upper inductance unit described below. The connection electrode 61*a*, the connection electrode 62*c*, and the connection electrode 63*a* are disposed stacked one on the other. The connection electrode 62*c* is not connected to the inner electrode 62*b*.

On the other hand, the bottom surface of the connection electrode 63*a* is stacked on the inner electrode 64*a*. Therefore, the upper coil conductor is electrically connected to the inner electrode 64*a*.

The bottom surface of the inner electrode 64*a* is stacked on the connection electrode 65*a*. The connection electrodes 65*a*, 66*c*, and 67*a* are stacked one on the other. The bottom surface of the connection electrode 67*a* is electrically connected to the inner electrode 68*a*. Therefore, the inner electrode 64*a* and the inner electrode 68*a* are electrically connected to each other.

The inner electrode 68*a* is electrically connected to the connection electrode 69*a* provided in the green sheet 69. The connection electrode 69*a* is electrically connected to the coil conductor of the lower inductance unit at the bottom surface side.

The connection electrode 66*c* is not electrically connected to the inner electrode 66*a*.

Therefore, in the portion where the aforementioned green sheets 61 to 69 are laminated, the capacitance is derived between the inner electrodes 62*a* and 66*a*, and the inner electrodes 64*a* and 68*a*.

On the other hand, green sheets 71 to 74 are laminated above the green sheets 61 to 69 to define the first inductance unit. A plurality of layers of the green sheet 71 are laminated, and on the green sheet 71, a connection electrode 71*a* and a ceramic layer 71*b* disposed in the surrounding area of the connection electrode 71*a* are provided. The green sheets 72 to 74 include inner electrodes 72*a*, 73*a*, and 74*a* to define the inductor defining the coil, and ceramic layers 72*b*, 73*b*, and 74*b* are provided in the surrounding area thereof, respectively. The inner electrodes 72*a*, 73*a*, and 74*a* defining the inductor are laminated, and thereafter are electrically connected to each other to define the coil. The lower end of the coil is electrically connected to the connection electrode 61*a*, and the upper end is connected to the connection electrode 71*a*.

Furthermore, the second inductance unit is also similarly laminated under the capacitor unit. In the second inductance unit, green sheets 81, 82, 83, and 84 are laminated. The green sheets 81 to 84 are similarly to the green sheets 71 to 74. That is, inner electrodes 81*a*, 82, and 83*a* defining the inductance in the green sheets 81 to 83 are connected to define a coil after lamination. The upper end of the coil is electrically connected to the connection electrode 69*a* provided in the green sheet 69.

The lower end of the coil of the second inductance unit is electrically connected to the connection electrode 84*a* provided in the green sheet 84. The green sheet 84 is laminated in a plurality of layers.

Figure 11:
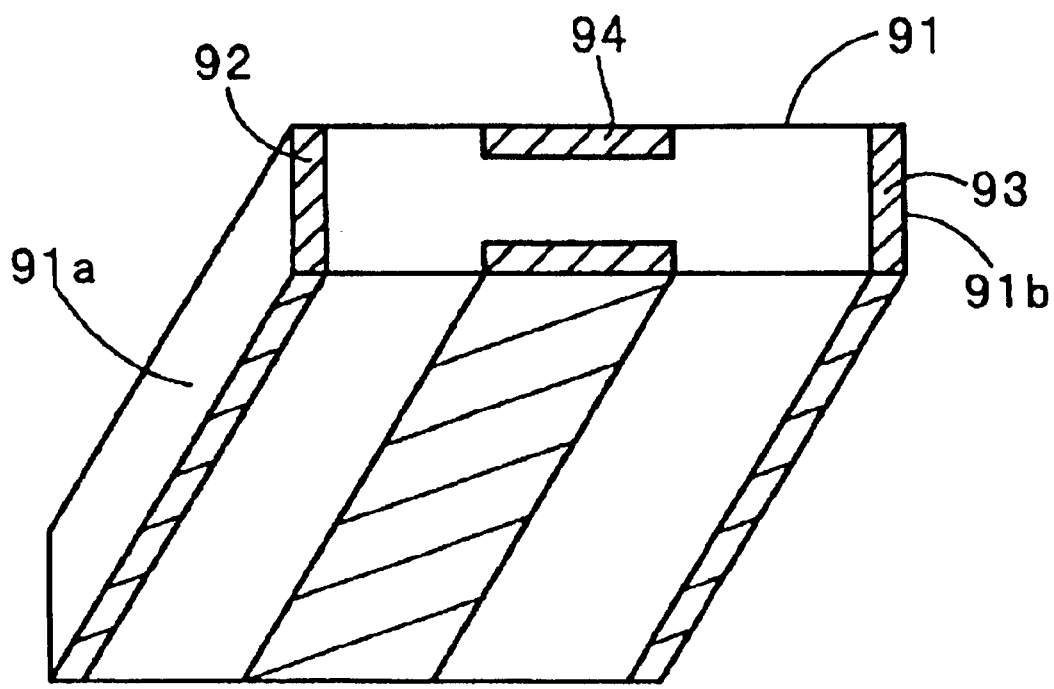
FIG. 11 is a perspective assembly drawing illustrating a modified embodiment of a laminated LC part according to the third preferred embodiment of the present invention.

The aforementioned green sheets 61 to 69, 71 to 74, and 81 to 84 are laminated to produce a laminate. This laminate is fired to yield a ceramic sintered body 91 as shown in FIG. 11. In the ceramic sintered body 91, the direction of bonding of the end surface 91*a* and the end surface 91*b* is in the same direction as the aforementioned lamination. Then, outer electrodes 92 and 93 are provided to cover the end surfaces 91*a* and 91*b* of the ceramic sintered body 91. Outer electrode 94 is provided in the approximate center of the ceramic sintered body 91. The outer electrodes 92 and 93 are electrically connected to the aforementioned connection electrodes 71*a* and 84*a*. The aforementioned outer electrodes 92 and 93 are schematically shown in FIG. 10.

Figure 12:
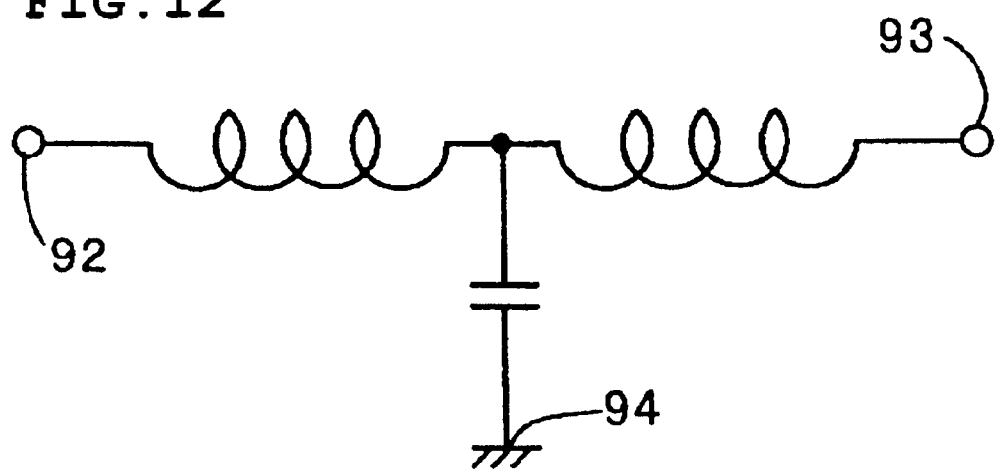
FIG. 12 is a drawing of a circuit constitution of the laminated LC part shown in FIG. 11.

The electrode 94 is electrically connected to the inner electrodes 62*a* and 66*a* to define the capacitor. Therefore, according to the present preferred embodiment, the laminated LC filter having a circuit constitution as shown in FIG. 12 is produced.

In the first preferred embodiment and in the modified embodiment, the manufacturing method for the laminated inductor was explained. The present invention is, however, used for the manufacture not only of laminated inductors, but also for other laminated ceramic electronic components, for example, laminated varistors, laminated thermistors, monolithic capacitors, laminated LC filters, multilayer substrates, laminated modules, and other suitable laminated ceramic electronic components. That is, by using the method for the manufacture of various laminated ceramic electronic components, similarly, the distortion during the adhesion by pressing, in which the laminate before firing is pressed in the direction of the thickness, is greatly reduced and the laminated ceramic electronic component exhibits much less delamination, and superior reliability is obtained. Furthermore, because the thickness of the inner electrode is greatly increased, besides the increase in inductance, the current carrying capacity is also greatly improved.

In the manufacturing method of the laminated ceramic electronic component according to the first preferred embodiment of the invention, because the inner electrode paste layer is provided in the portion of the green sheet being having an inner electrode, and the ceramic paste layer is provided except in the portions where the inner electrode paste layer is provided, in other words, because the inner electrode is provided to penetrate the green sheet from the top surface to the bottom surface, in the case in which the laminate obtained by laminating the green sheet is fired to yield the ceramic sintered body, the thickness of the inner electrode is greatly increased compared to that of a conventional laminated ceramic electronic component in which the conductive paste is printed on the green sheet to form the inner electrode. Therefore, the inductance and the current carrying capacity is greatly improved, and direct current resistance is greatly reduced.

Furthermore, in the aforementioned green sheet, because the portion in which the inner electrode is provided and the ceramic paste layer have the same thickness, distortion during the adhesion by pressing does not occur when the aforementioned laminate is pressed in the direction of the thickness before firing. Therefore, delamination of the ceramic sintered body in the laminated ceramic electronic component is effectively suppressed and a laminated ceramic electronic component exhibiting superior reliability is obtained.

The aforementioned ceramic paste printing process and inner electrode paste printing process are not restricted as to the order of execution.

In the manufacturing method according to the present invention, in the process in which the same green sheet in a state supported by the carrier film is adhered by pressing, and thereafter the carrier film is peeled off, and this is repeated a plurality of times, an inner electrode having a larger thickness, in which a plurality of layers of the inner electrode paste layer are laminated, is produced.

In the manufacturing method of the laminated ceramic electronic component according to the second preferred embodiment of the present invention, the first and second composite sheets including the inner electrode and the ceramic green sheet, which are supported on the carrier film, and in which the inner electrode penetrates both primary surfaces, are prepared; the first composite sheet is adhered by pressing and thereafter the carrier film is peeled off; the second composite sheet is laminated and adhered by pressing to the first composite sheet, and thereafter the carrier film on the second composite sheet is peeled off, thereby the inner electrode layers of the first and the second composite sheet are laminated to define the inner electrode. Therefore, an inner electrode having a greatly increased thickness is obtained. In the laminate obtained by the aforementioned laminating process, since there is little difference in thickness between the portion wherein the inner electrode is provided and other portions, the distortion due to the adhesion by pressing does not occur during the process of pressing in the direction of the thickness before firing. Therefore, the laminated ceramic electronic component in which delamination does not occur exhibits superior reliability and is easily obtained.

In the manufacturing method of the laminated ceramic electronic component according to the second preferred embodiment of the invention, the electrode green sheet, which is provided on the carrier film, and in which the inner electrode defining the inductor penetrates the top surface and the bottom surface, and the connection electrode green sheet, which is supported on the carrier film, and in which the connection electrode is exposed at the top surface and the bottom surface, are prepared; and the inner electrode defining the inductor is electrically connected via the connection electrode to define the coil conductor. Therefore, as in the first and second preferred embodiments of the invention, because the inner electrode defining the inductor penetrates the green sheet from the top surface to the bottom surface, the thickness of the coil conductor is greatly increased and a greatly increased inductance is obtained. Furthermore, in the green sheet, there is little difference in the thickness between the portion wherein the inner electrode is provided and the other portions, and the distortion due to the adhesion by pressing when the laminate is pressed in the direction of the thickness before firing is greatly reduced. Therefore, a laminated inductor, in which delamination does not occur and which has superior reliability is obtained.

In the third preferred embodiment of the invention, in the case in which a plurality of layers of the green sheet, including the inner electrode defining the inductor having the same shape, are laminated, the inner electrode defined by the plurality of layers produces a greatly increased inductance.

In the third preferred embodiment, by adhering the electrode green sheet and the connection electrode green sheet by pressing and thereafter peeling the carrier film, the composite sheet of the aforementioned inner electrode or connection electrode, and the ceramic layer, is easily produced, and the lamination is reliably performed.

In the manufacturing method for the laminated ceramic electronic component according to the fourth preferred embodiment of present invention, the electrode green sheet, in which the ceramic layer is provided surrounding the inner electrode defining the inductor, is laminated such that the inner electrodes are electrically connected to each other to define the coil conductor, and the laminate is obtained. Therefore, similarly to the first to third preferred embodiments of invention, an inner electrode having a greatly increased thickness, that is, the coil conductor, is produced, and a greatly increased inductance is obtained.

Since the distortion due to the adhesion by pressing does not occur during the process of pressing in the direction of the thickness before firing, a laminated inductor, in which delamination does not occur, and exhibiting superior reliability is obtained.

In the fourth preferred embodiment of the present invention, by peeling the carrier film after adhering the electrode green sheet by pressing, handling of the electrode green sheet is greatly simplified.

In the fourth preferred embodiment of the present invention, where a plurality of layers of the green sheet having the inner electrode defining the inductor having the same shape are provided and directly laminated, the inner electrode defining the inductor over the plurality of layers is configured such that the thickness of the coil conductor is further increased, and an even greater inductance is obtained.

In the manufacturing method of the laminated ceramic electronic component according to the fifth preferred embodiment of the present invention, similarly to the third preferred embodiment of the present invention, a plurality of layers of the electrode green sheet defining the inductor, composed of the inner electrode defining the inductor and the ceramic layer provided in the surrounding area thereof, are laminated to define the inductance unit. Furthermore, the electrode green sheet defining the capacitor, including the inner electrode defining the capacitor and the ceramic layer provided in the surrounding area thereof, is laminated, interposing a green sheet prevents the upper and the lower inner electrodes defining the capacitor from short-circuiting, so as to define the capacitor unit.

Therefore, according to the present invention, the simultaneous firing type laminated LC component, in which the capacitor unit and the inductance unit are integrated, is provided. In the fifth preferred embodiment of the present invention, in the inductance unit, similarly to the third preferred embodiment of the present invention, the thickness of the coil conductor is greatly increased, and therefore, a greatly increased inductance is easily obtained. In addition, in the capacitor unit, because the thickness of the inner electrode is greatly increased, the resistance is greatly reduced and the current carrying capacity is greatly improved.

In the fifth preferred embodiment of the present invention, in the case in which a magnetic ceramic is used as the ceramic defining the inductance unit, and a dielectric ceramic is used as the ceramic defining the capacitor unit, a laminated LC component exhibiting greatly increased inductance and capacitance is achieved.

In the laminated ceramic electronic component according to the present invention, because the inner electrode provided in the ceramic sintered body has a thickness substantially equal to the entirety of the plurality of ceramic layers, the inductance and the current carrying capacity is greatly increased.

In the case in which the plurality of inner electrodes are directly electrically connected in the ceramic sintered body, because only the green sheet, in which the inner electrode is provided, is necessarily prepared, a laminated ceramic electronic component exhibiting greatly increased inductance and current carrying capacity is efficiently provided.

In the laminated ceramic electronic component according to the present invention, in the case in which the plurality of inner electrodes are electrically connected via the connection inner electrode, the coil conductors of various winding patterns are easily obtained.

While the invention has been particularly shown and described with reference to preferred embodiments thereof, it will be understood by those skilled in the art that the foregoing and other changes in form and details can be made without departing from the spirit and scope of the invention.

What is claimed is:

1. A manufacturing method for a laminated ceramic electronic component, comprising:
   printing a ceramic paste on a carrier film except in a portion on which an inner electrode is to be provided;
   printing an inner electrode paste on the portion of said carrier film on which the inner electrode is to be provided, such that at least three green sheets including the ceramic paste and the inner electrode paste are produced;
   repeatedly laminating said at least three green sheets, in which a laminate of said green sheet and said carrier film is adhered by pressing to another of said at least three green sheets on a lamination stage such that each of said inner electrode pastes of said at least three green sheets printed on said carrier film overlaps and is in contact with another of said inner electrode pastes along substantially the entire length of each of said inner electrode pastes;
   repeatedly peeling off said carrier film to obtain a ceramic laminate; and
   firing said ceramic laminate to obtain a ceramic sintered body; wherein said inner electrode pastes of said at least three green sheets define a portion of a coil conductor.

2. A manufacturing method for the laminated ceramic electronic component according to claim 1, wherein said step of printing the ceramic paste is performed after said step of printing the inner electrode paste.

3. A manufacturing method for the laminated ceramic electronic component according to claim 1, wherein said step of printing the ceramic paste is executed before said step of printing the inner electrode paste.

4. A manufacturing method for the laminated ceramic electronic component according to claim 1, wherein said at least three green sheets, on which the inner electrode pastes having substantially the same shape are provided, and which are supported by a carrier film, are laminated and adhered by pressing to another green sheet on a lamination stage, and thereafter the carrier film is peeled off, said laminating, pressing and peeling steps are repeated a plurality of times to produce an inner electrode having a thickness in the direction of which a plurality of inner electrode pastes are laminated.

5. A manufacturing method for the laminated ceramic electronic component, according to claim 1 further comprising:
   preparing at least a layer of a plain ceramic green sheet separately by a sheet manufacturing method; and
   laminating said plain ceramic green sheet on an outermost layer portion.

6. A manufacturing method for the laminated ceramic electronic component, comprising:
   preparing a first composite sheet, a second composite sheet and a third composite sheet, which are supported on a carrier film, and in which an inner electrode paste layer and a ceramic green sheet layer are formed such that the inner electrode paste layer penetrates both primary surfaces of the ceramic green sheet layer;
   laminating and adhering the first composite sheet by pressing to another green sheet on a lamination stage, and thereafter peeling off the carrier film;
   laminating and adhering the second composite sheet by pressing to the first composite sheet, and thereafter peeling off the carrier film laminated on the second composite sheet, and laminating and adhering the third composite sheet by pressing to the second composite sheet, and thereafter peeling off the carrier film laminated on the third composite sheet, thereby providing an inner electrode in which the inner electrode paste layers of the first, the second, and the third composite sheets are laminated such that each of the inner electrode paste layers overlaps and is in contact with another of said inner electrode paste layers along substantially the entire length of each of the inner electrode paste layers; and
   firing the laminate obtained by said laminating and adhering steps to obtain a ceramic sintered body; wherein said inner electrode paste layers define a portion of a coil conductor.

7. A manufacturing method for the laminated ceramic electronic component, according to claim 6 further comprising:
   preparing at least a layer of plain ceramic green sheet separately by a sheet manufacturing method; and
   laminating said plain ceramic green sheet on an outermost layer portion.

8. A manufacturing method for the laminated ceramic electronic component, comprising:

preparing at least three layers of electrode green sheets, which are supported on a carrier film, and in which a ceramic layer is arranged to surround an inner electrode defining an inductor such that the inner electrode defining the inductor penetrates the top surface and the bottom surface of the ceramic layer;

preparing at least a layer of a connection electrode green sheet, which is supported on a carrier film, and in which a ceramic layer is arranged to surround the connection electrode such that the connection electrode is exposed at the top surface and the bottom surface of the ceramic layer;

repeatedly laminating the at least three electrode green sheets and the connection electrode green sheet to obtain a laminate;

repeatedly peeling off the carrier film such that the inner electrode defining an inductor is electrically connected via the connection electrode to define a portion of a coil; and firing said laminate to obtain a ceramic sintered body; wherein each of the inner electrodes overlaps and is in contact with another of said inner electrodes along substantially the entire length each of the inner electrodes.

9. A manufacturing method for the laminated ceramic electronic component, according to claim 8 further comprising:

preparing at least a layer of plain ceramic green sheet separately by a sheet manufacturing method; and laminating said plain ceramic green sheet on an outermost layer portion.

10. A manufacturing method of the laminated ceramic electronic component according to claim 8, wherein said at least three layers of said electrode green sheets, on which the inner electrodes having the same shape defining an inductor are provided, are laminated to define an inner electrode over said plurality of layers.

11. A manufacturing method for the laminated ceramic electronic component according to claim 8, wherein, in said laminating step, said carrier film is peeled off after adhering the electrode green sheet and the connection electrode green sheet by pressing.

12. A manufacturing method for the laminated ceramic electronic component, comprising:

preparing at least three electrode green sheets, which are supported on a carrier film, and in which a ceramic layer is arranged to surround an inner electrode defining an inductor such that the inner electrode defining the inductor is exposed at the top surface and the bottom surface of the ceramic layer;

repeatedly laminating said at least three electrode green sheets to obtain a laminate;

repeatedly peeling off the carrier film such that the inner electrodes are electrically connected to each other to define a portion of a coil conductor; and firing said laminate to obtain a ceramic sintered body; wherein each of the inner electrodes overlaps and is in contact with another of said inner electrodes along substantially the entire length of each of the inner electrodes.

13. A manufacturing method for the laminated ceramic electronic component according to claim 12, wherein said carrier film is peeled off after adhering said electrode green sheet by pressing.

14. A manufacturing method for the laminated ceramic electronic component according to claim 12, wherein said at least three layers of the electrode green sheet, on which the inner electrodes having substantially the same pattern to define an inductor are provided, are directly laminated to define an inner electrode over the plurality of layers.

15. A manufacturing method for the laminated ceramic electronic component, according to claim 12 further comprising:

preparing at least a layer of plain ceramic green sheet separately by a sheet manufacturing method; and laminating said plain ceramic green sheet on an outermost layer portion.

16. A manufacturing method for the laminated ceramic electronic component, comprising:

preparing at least three layers of electrode green sheet to define an inductor, which are supported on a carrier film, and in which a ceramic layer is provided surrounding an inner electrode defining the inductor such that the inner electrode defining the inductor penetrates the top surface and the bottom surface of the ceramic layer;

preparing a plurality of layers of electrode green sheet to define a capacitor, which are supported on a carrier film, and in which a ceramic layer is arranged to surround an inner electrode defining the capacitor such that the inner electrode defining the capacitor penetrates the top surface and the bottom surface of the ceramic layer;

preparing at least one plain ceramic green sheet supported on a carrier film;

a first step of laminating said at least three electrode green sheets to define the inductor while peeling off the carrier film such that the plurality of layers of inner electrode defining an inductor are electrically connected in the direction of the lamination to define a portion of a coil;

a second step of laminating said plurality of electrode green sheets defining the capacitor and said at least one plain green sheet while peeled off the carrier film such that the plurality layers of electrode green sheet defining the capacitor are laminated with said at least one plain green sheet interposed therebetween; and firing the laminate, obtained by executing said first and second laminating step in order or in reverse order to obtain a ceramic sintered body; wherein each of the inner electrodes defining the inductor overlaps and is in contact with another of said inner electrodes along substantially the entire length of each of the inner electrodes.

17. A manufacturing method for the laminated ceramic electronic component, according to claim 16 further comprising:

preparing at least a layer of plain ceramic green sheet separately by a sheet manufacturing method; and laminating said plain ceramic green sheet on an outermost layer portion.

18. A manufacturing method for the laminated ceramic electronic component, according to claim 16, wherein a magnetic ceramic is used as the ceramic layer for said electrode green sheet to define the inductor, and a dielectric ceramic is used as the ceramic layer for said electrode green sheet to define the capacitor.

* * * * *